United States Patent
Schwarzmann et al.

(10) Patent No.: US 9,438,097 B2
(45) Date of Patent: Sep. 6, 2016

(54) METHOD FOR CONTROLLING THE CURRENT INTENSITY OF THE ELECTRIC CURRENT FLOWING THROUGH AN INDUCTIVE CONSUMER AND A CORRESPONDING CIRCUIT CONFIGURATION

(71) Applicant: Robert Bosch GmbH, Stuttgart (DE)

(72) Inventors: Dieter Schwarzmann, Heilbronn (DE); Marco Martini, Reutlingen (DE); Christian Klein, Oberriexingen (DE); Thomas Wieja, Gomaringen (DE); Bernd Mueller, Reutlingen (DE); Uwe Guenther, Nufringen (DE); Alexander Herrmann, Stuttgart (DE); Steffen Reinhardt, Pforzheim (DE); Beate Leibbrand, Muehlacker (DE); Christian Lammers, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 15 days.

(21) Appl. No.: 14/424,534

(22) PCT Filed: Jul. 31, 2013

(86) PCT No.: PCT/EP2013/066058
§ 371 (c)(1),
(2) Date: Feb. 27, 2015

(87) PCT Pub. No.: WO2014/032893
PCT Pub. Date: Mar. 6, 2014

(65) Prior Publication Data
US 2015/0207395 A1    Jul. 23, 2015

(30) Foreign Application Priority Data
Aug. 27, 2012    (DE) .................. 10 2012 215 155

(51) Int. Cl.
*H02M 1/08* (2006.01)
*H02M 3/156* (2006.01)
(Continued)

(52) U.S. Cl.
CPC ............... *H02M 1/08* (2013.01); *G01R 19/00* (2013.01); *H01F 7/1844* (2013.01); *H02M 3/156* (2013.01); *H01F 2007/1866* (2013.01); *H01F 2007/1888* (2013.01); *H02M 2003/1555* (2013.01)

(58) Field of Classification Search
CPC ......... H02M 1/08; H02M 2001/0012; H02M 2003/1555
See application file for complete search history.

(56) References Cited

U.S. PATENT DOCUMENTS 3,560,834 A  *  2/1971  Studtmann .............. H02M 1/08
                                                       318/807
(Continued)

FOREIGN PATENT DOCUMENTS

DE      102007028344      12/2008
WO      WO2006/037715     4/2006

OTHER PUBLICATIONS

International Search Report for PCT/EP2013/066058, issued on Sep. 22, 2014.

(Continued)

*Primary Examiner* — Timothy J Dole
*Assistant Examiner* — Yusef Ahmed
(74) *Attorney, Agent, or Firm* — Norton Rose Fulbright US LLP

(57) ABSTRACT

A method is provided for controlling the current intensity of the electric current flowing through an inductive consumer, the consumer being connected in series to a switching device and a current measuring unit, and in parallel to a freewheeling element, and the switching device being activated for adjusting the current intensity during a pulse width modulation period. It is provided that a mean load voltage to be set during the pulse width modulation period is determined from an input current intensity with the aid of a first controller, the mean load voltage being set in the pulse width modulation period with the aid of the switching device at the consumer, the mean load voltage or a setpoint load voltage determined with the aid of a second controller from a predefined setpoint current intensity being fed to a model adapted to the consumer, and the input current intensity being ascertained from the difference between the predefined setpoint current intensity and a difference variable between an actual current intensity through the consumer and a model current intensity determined with the aid of the model. A circuit configuration for implementing the method is also provided.

10 Claims, 4 Drawing Sheets

(51) Int. Cl.
*H01F 7/18* (2006.01)
*G01R 19/00* (2006.01)
*H02M 3/155* (2006.01)

(56) References Cited

U.S. PATENT DOCUMENTS

| | | | | |
|---|---|---|---|---|
| 6,456,946 | B1* | 9/2002 | O'Gorman | B62D 5/0487 702/58 |
| 7,791,324 | B2* | 9/2010 | Mehas | H02M 3/1588 323/224 |
| 8,692,535 | B1* | 4/2014 | Sreenivas | H02M 3/156 323/285 |
| 2004/0232877 | A1* | 11/2004 | Kawaji | H02P 27/045 318/802 |
| 2005/0206358 | A1* | 9/2005 | Van Der Horn | H02M 3/156 323/282 |
| 2006/0015274 | A1* | 1/2006 | Trandafir | H02M 3/157 702/64 |
| 2007/0030068 | A1* | 2/2007 | Motonobu | F16H 61/12 330/257 |
| 2007/0035263 | A1* | 2/2007 | Rastogi | H02P 25/22 318/432 |
| 2008/0068866 | A1* | 3/2008 | Blanken | H02M 3/156 363/21.01 |
| 2008/0224636 | A1* | 9/2008 | Melanson | H05B 33/0815 315/307 |
| 2009/0067205 | A1* | 3/2009 | Oyobe | B60L 11/1842 363/98 |
| 2009/0167231 | A1* | 7/2009 | Sussmeier | H02P 5/695 318/610 |
| 2011/0115453 | A1* | 5/2011 | Marsili | H02M 3/1582 323/282 |
| 2012/0025727 | A1* | 2/2012 | Krick | H05B 33/0818 315/210 |
| 2012/0155132 | A1* | 6/2012 | Uno | H02M 1/4225 363/80 |
| 2012/0194110 | A1* | 8/2012 | Konig | H02P 27/08 318/400.17 |
| 2012/0212193 | A1* | 8/2012 | Sreenivas | H02M 3/1588 323/234 |
| 2012/0223692 | A1* | 9/2012 | Prodic | H02M 3/1584 323/283 |
| 2014/0097808 | A1* | 4/2014 | Clark | G05F 1/70 323/208 |
| 2015/0244269 | A1* | 8/2015 | Yu | H02M 3/156 323/284 |

OTHER PUBLICATIONS

Garcia, C. et al: "Internal Model Control-1. Unifying Review and Some New Results.", Industrial & Engineering Chemistry, Process Design and Development, vol. 21, No. 2, 1982, pp. 308-323.

Jaehong K. et al:"Inverter-Based Local AC Bus Voltage Control Utilizing Two DOF Control", Institute of Electrical and Electronics Engineers, vol. 23, No. 3, 2008, pp. 1288-1298.

* cited by examiner

METHOD FOR CONTROLLING THE CURRENT INTENSITY OF THE ELECTRIC CURRENT FLOWING THROUGH AN INDUCTIVE CONSUMER AND A CORRESPONDING CIRCUIT CONFIGURATION

FIELD OF THE INVENTION

The present invention relates to a method for controlling the current intensity of the electric current flowing through an inductive consumer, the consumer being connected in series to a switching device and a current measuring unit, and in parallel to a freewheeling element, and the switching device being activated for adjusting the current intensity during a pulse width modulation period. The present invention also relates to a circuit configuration.

BACKGROUND INFORMATION

The inductive consumer is, for example, an actuator or the like, which is used, in particular, in a transmission of a motor vehicle, for example, an automatic transmission. To operate the consumer, the consumer is supplied with electric current, and the behavior of the consumer is capable of being influenced by adjusting the current intensity. The consumer may be present, for example, in the form of a solenoid valve, in which a flow-through cross section for a fluid and, therefore, the flow-rate of the fluid through the solenoid valve, may be adjusted via the current intensity.

To control the current intensity, the consumer is connected in series to the switching device and to the current measuring unit. The switching device is used either to supply the consumer with electric current or to interrupt the current feed. This takes place using a pulse width modulation method, so that the switching device is correspondingly activated for adjusting the current intensity during a pulse width modulation period or during a plurality of successive pulse width modulation periods. The activation occurs here with a certain pulse duty factor, which indicates over which temporal portion of each pulse width modulation period the consumer is to be supplied with electric current.

At a pulse duty factor of zero, for example, no current at all is supplied to the consumer, whereas at a pulse duty factor of one, current is supplied over the entire pulse width modulation period. The pulse duty factor is normally established separately for each pulse width modulation period. Any arbitrary pulse duty factor from zero to one is, of course, selectable, so that the portion of the pulse width modulation period during which the consumer is supplied with electric current may be arbitrarily adjusted. Accordingly, the behavior of the consumer may also be arbitrarily influenced.

The current measuring unit is used to determine, in particular by measuring, the electric current actually flowing through the consumer, or the current intensity thereof. The current measuring unit in this case includes, for example, a so-called shunt resistor. Based on the voltage drop across the resistor, it is possible to deduce the current intensity of the electric current flowing through the consumer and the shunt resistor. The free-wheeling element, which is designed, for example, as a free-wheeling diode, is normally present in parallel to the consumer. The free-wheeling element is used, in particular, to protect the consumer from over-voltages, which may occur when the power supply of the inductive consumer is interrupted with the aid of the switching device, primarily as a result of self-induction. The free-wheeling element thereby prevents the occurrence of excessive voltages and, thus, potential adverse effects or damage to the inductive consumer.

Due, in particular, to the self-induction of the inductive consumer, the latter exhibits a hysteresis-like behavior, which means that an exact adjustment of the current intensity may no longer be readily carried out due to inaccuracies resulting from the hysteresis-like behavior, so that the actual current intensity of the electric current flowing through the inductive consumer may only be approximately adjusted.

SUMMARY

The method of the present invention, in contrast, has the advantage that the current intensity of the electric current flowing through the inductive consumer is controlled with a higher degree of accuracy than in methods known from the related art. This is achieved according to the present invention in that a mean load voltage to be set during the pulse width modulation period is determined from an input current intensity with the aid of a first controller, the mean load voltage being set during the pulse width modulation period with the aid of the switching device at the consumer, the mean load voltage or a setpoint load voltage determined with the aid of a second controller from a predefined setpoint current intensity being supplied to a model adapted to the consumer, and the input current intensity being ascertained from the difference between the predefined setpoint current intensity and a difference variable between an actual current intensity through the consumer and a model current intensity determined with the aid of the model. Thus, on the whole, it is provided to control the current intensity with the aid of a so-called IMC controller (IMC: internal model control). In this way, the parameterization of the first controller is simplified, because it takes place directly based on the properties of the inductive consumer, thus, in particular, due to the inductivity and the resistance of the consumer. The application complexity of the system is accordingly reduced.

It is also provided that the pulse duty factor to be set at the switching device is, for example, not directly ascertained from the input current intensity with the aid of the first controller. Instead, a mean load voltage to be set must initially be determined. The pulse duty factor is, in particular, a function of a supply voltage of a power supply connected to the consumer via the switching device. In addition, a dependency of the pulse duty factor on the free-wheeling voltage of the free-wheeling element exists, which becomes important when the power supply of the consumer is interrupted with the aid of the switching device. The supply voltage of the power supply, designed, for example, as a battery or a rechargeable battery, is normally superposed, however, by dynamic disturbances, i.e., voltage drops or voltage jumps, for example. If, during the pulse width modulation period, the first controller were to directly calculate the pulse duty factor to be set, then these disturbances would be incorporated as disturbance variables in the applied control algorithm.

In order to limit the impact of the disturbances on the stability of the control, the piece of information provided to the first controller would have to be filtered, e.g., low-pass filtered via the instantaneous supply voltage. However, this in turn would mean that changes in the supply voltage could only be corrected by a delay resulting from the filtering. This is a problem, in particular, in the case of voltage jumps to high voltages, because these could cause damage to the consumer. Accordingly, it is now provided to determine only the mean load voltage, from which in a next step, for example, the pulse duty factor is ascertained, or which is used to activate the switching device. The mean load voltage corresponds to the voltage, which the first controller aims to set at the consumer during the (next) pulse width modulation period, in order to achieve the desired current intensity.

To implement the IMC control method, there is, in addition to the first controller, a model of the consumer, which provides a current intensity analogously to the actual controlled system, namely, the consumer. This is referred to in the case of the model as the model current intensity. The model current intensity represents the output variable, in particular, the sole output variable of the model. As the input variable, in particular, as the sole input variable, either the mean load voltage, which is determined with the aid of the first controller and also set during the pulse width modulation period with the aid of the switching device, is fed to the model. Alternatively, a setpoint load voltage may also be fed to the model, which is determined with the aid of the second controller. The setpoint current intensity is fed as the input variable to this second controller, preferably, as well as to the first controller.

To close the control loop, which includes the first controller, the input current intensity fed to the control loop is determined from a difference, in which the difference variable is subtracted from the setpoint current intensity. The difference variable lies between the actual current intensity, which is determined or measured, for example, with the aid of the current measuring unit, and the model current intensity obtained while using the model. The difference variable is, for example, the difference between the actual current intensity and the model current intensity. The setpoint current intensity is the current intensity which is to be set at the consumer. Thus, in an ideal model, which corresponds fully to the consumer, and in which no disturbances occur, the difference variable is thus always equal to zero, so that the setpoint current intensity in this case is fed to the first controller as the input current intensity or as the input variable.

In one refinement of the present invention, it is provided that the mean load voltage is limited downward to a minimum value and/or upward to a maximum value. Instead of or in addition to the limitation of the mean load voltage, the absolute value of the mean load voltage may also be limited. With the aid of the downward limitation, it is ensured that the load voltage, or the mean load voltage, does not become smaller than a minimum implementable voltage. Alternatively, or in addition, the limitation may take place in such a way that the load voltage, or the mean load voltage, does not exceed the maximum value. In this way, it is ensured, in particular, that the predefined mean load voltage is not greater than an available supply voltage of the power supply.

Similarly, it may be provided in another embodiment of the present invention that a mean supply voltage of a power supply for the consumer is used as the maximum value. The power supply is designed, for example, as a battery or a rechargeable battery. The supply voltage may fluctuate as a result of different loads of the power supply at different points in time, in particular as a result of additional consumers. For this reason, a mean value, namely the mean supply voltage, preferably not the supply voltage itself, is used as the maximum value. The mean supply voltage is obtained, for example, by a filtering of the instantaneous supply voltage, in particular with the aid of a low-pass filter.

In addition, or alternatively, it may be provided that a free-wheeling voltage or the absolute value of the free-wheeling voltage of the free-wheeling element is used as the minimum value. Thus, the minimum value is determined by the property of the free-wheeling element, and is normally constant, whereas the maximum value may change over time.

One refinement of the present invention provides that at least once during the pulse width modulation period, a pulse duty factor for the pulse width modulation period to be set with the aid of the switching device is determined from the mean load voltage and the instantaneous supply voltage of the power supply. As explained above, the mean load voltage is ascertained with the aid of the first controller. Based on the mean load voltage, the switching device must be subsequently activated in order to control or set the desired current intensity of the electric current flowing through the consumer. For example, it may be provided that at the start or prior to the start of the pulse width modulation period, the pulse duty factor for the pulse width modulation period is established from the mean load voltage. In this case, the instantaneous supply voltage of the power supply, in addition to the mean load voltage, may also be incorporated. Alternatively, it is, of course, also possible to use the mean supply voltage.

In such an approach, the switching device is set in accordance with the certain pulse duty factor during the pulse width modulation period. Advantageously, however, the pulse duty factor is determined multiple times during the pulse width modulation period, or the switching device is activated in such a way that a certain pulse duty factor is set. This occurs particularly preferably based on the instantaneous supply voltage. In this way, it is possible to compensate for fluctuations of the supply voltage, so that they are not reflected in a deviation of the actual current intensity from the setpoint current intensity, or negatively affect the control of the current intensity. For example, a counter is set to zero at the beginning of the pulse width modulation period and during the pulse width modulation period is incremented in successive work cycles for a particular duration by a value which corresponds to the instantaneous supply voltage divided by the duration of the (entire) pulse width modulation period. As long as this counter is less than the mean load voltage, the switching device is activated to supply the consumer with electric current. If, on the other hand, the counter exceeds the mean load voltage, the switching device is activated to interrupt the power supply. Analogous approaches are, of course, also possible.

Another embodiment of the present invention provides that the mean load voltage is determined from the input current intensity with the aid of the first controller at a pulse width modulation frequency, and that the pulse duty factor is determined at a sampling frequency, the sampling frequency being selected to be greater than the pulse width modulation frequency. The pulse width modulation frequency is derived from the reciprocal value of the duration of the pulse width modulation period. The pulse width modulation frequency is preferably constant, but may also be selected to be variable. As explained above, the sampling frequency may be determined multiple times during the pulse width modulation period, or the switching device may be activated in such a way that the certain pulse duty factor is set.

The sampling frequency, at which the pulse duty factor is determined during the pulse width modulation period, or at which the switching device is activated, is intended to be correspondingly greater than the pulse width modulation frequency. In particular, it is significantly greater, for example, by a factor of 2, 3, 4, 5, 10, 25 or 50. Thus, the pulse duty factor is adapted during the pulse width modulation period to an instantaneous supply voltage, which changes under certain circumstances. Thus, during the actual activation of the switching device, it is possible to take into account the instantaneous supply voltage, and to therefore reduce the influence of disturbances to the supply voltage without the first controller having to intervene. Accordingly, an extremely stable control loop is achieved. In this case, it may also be useful to take the free-wheeling voltage into account when calculating the pulse duty factor.

In one particularly preferred specific embodiment of the present invention, it is provided that the setpoint current intensity is determined from a target current intensity and a superposition current intensity, the superposition current intensity being determined from the superposition target current intensity with the aid of an inverted transfer function of a control loop made up of the first controller and the consumer. Thus, the setpoint current intensity, from which the input current intensity is ultimately determined, is itself composed of multiple values, namely, the target current intensity and the superposition current intensity. The target current intensity in this case describes, for example, that current intensity with which a desired state of the consumer is achieved. In this respect, the target current intensity is a mean current intensity, which remains constant, frequently over multiple pulse width modulation periods. The superposition current intensity, on the other hand, preferably changes periodically and, in that respect, corresponds to a dither signal. The superposition current intensity is determined, for example, based on a predefined curve over time, which continues periodically.

Thus, the setpoint current intensity does not correspond to the target current intensity, but rather is periodically reduced or increased based on the target current intensity. The superposition current intensity in this case is normally significantly less than the target current intensity. The result of superposing the superposition current intensity on the target current intensity is that at no point in time does a movable element of the inductive consumer come to a stop and, accordingly, pass into a state of static friction. Instead, the element is always kept in motion, so that it is in a state of sliding friction. In this way, it is possible to achieve a minimum hysteresis of the consumer, or of the movable element of the consumer.

The superposition current intensity is calculated from the superposition target current intensity, the latter being determined, for example, from a table or based on a mathematical formula, each of which preferably includes the time or an equivalent variable as the parameter. The inverted transfer function is applied to the superposition target current intensity, which yields the superposition current intensity. The transfer function describes the control loop, which is made up of the first controller and the consumer. The application of the inverted transfer function ensures that the superposition target current intensity is actually applied at the consumer and is not changed by the first controller or by other influences.

In principle, the superposition target current intensity may progress arbitrarily over time. Normally, however, positive values alternate with negative values, so that initially a positive value exists over a particular first number of pulse width modulation periods, and a negative value of the superposition target current intensity exists over a subsequent number of pulse width modulation periods, whereby each of the values may change in amplitude in the positive or negative range. The number of pulse width modulation periods in this case may be the same or may differ. Similarly, the amplitude of the superposition target current intensity may be selected in both ranges to be the same or different.

It must always be noted, however, that the mean value over a period of the superposition target current intensity is equal to 0, so that in this respect, a mean value neutrality exists. For example, the curve of the superposition target current intensity has a sinusoidal profile.

One advantageous refinement of the present invention provides that the difference variable corresponds to the difference, one guided in particular by a transfer element, between the actual current intensity through the consumer and the model current intensity determined with the aid of the model. As explained above, the difference variable may be the same as the difference between the actual current intensity and the model current intensity, the latter being subtracted from the former. Using the superposition current intensity or the superposition target current intensity may result in a shift of the mean current intensity of the electric current flowing through the consumer—averaged over a period of the superposition target current intensity. This case occurs, in particular, if the control loop, made up of the first controller and the consumer, is unable to follow the supply voltage and/or the free-wheeling voltage due to the selected time constants. The resulting error in this case is referred to as a mean value error, and is preferably corrected. In this case, the behavior of the first controller is utilized by restoring the difference variable as described. The difference variable in this case is particularly preferably guided by the transfer element.

This transfer element may be, for example, a P-element, an I-element, a D-element or an arbitrary combination of these.

Finally, in another embodiment of the present invention, it may be provided that the target current intensity, the setpoint current intensity and/or the input current intensity are filtered. Thus, a single one of the aforementioned current intensities or multiple, in particular, all of the aforementioned current intensities may be subjected to a filtering. In this way, sudden changes in the current intensity are avoided and the stability of the control is improved.

The present invention also relates to a circuit configuration, which includes a control unit for controlling the current intensity of the electric current flowing through the consumer, in particular, a circuit configuration for carrying out the method described above, the consumer being connected in series to a switching device and a current measuring unit, and in parallel to a freewheeling element, and the control unit being designed to activate the switching device for adjusting the current intensity during a pulse width modulation period. The control unit is also provided to determine a mean load voltage to be set during the pulse width modulation period from an input current intensity with the aid of a first controller, the mean load voltage being set during the pulse width modulation period with the aid of the switching device at the consumer, the mean load voltage or a setpoint load voltage determined with the aid of a second controller from a predefined setpoint current intensity being supplied to a model adapted to the consumer, and the input current intensity being ascertained from the difference between the predefined setpoint current intensity and a difference variable between an actual current intensity through the consumer and a model current intensity determined with the aid of the model. The advantages of such an approach have been previously noted. The circuit configuration and the method may, of course, be further refined according to the preceding implementations, so that in this regard reference is made thereto.

DETAILED DESCRIPTION

Figure 1:
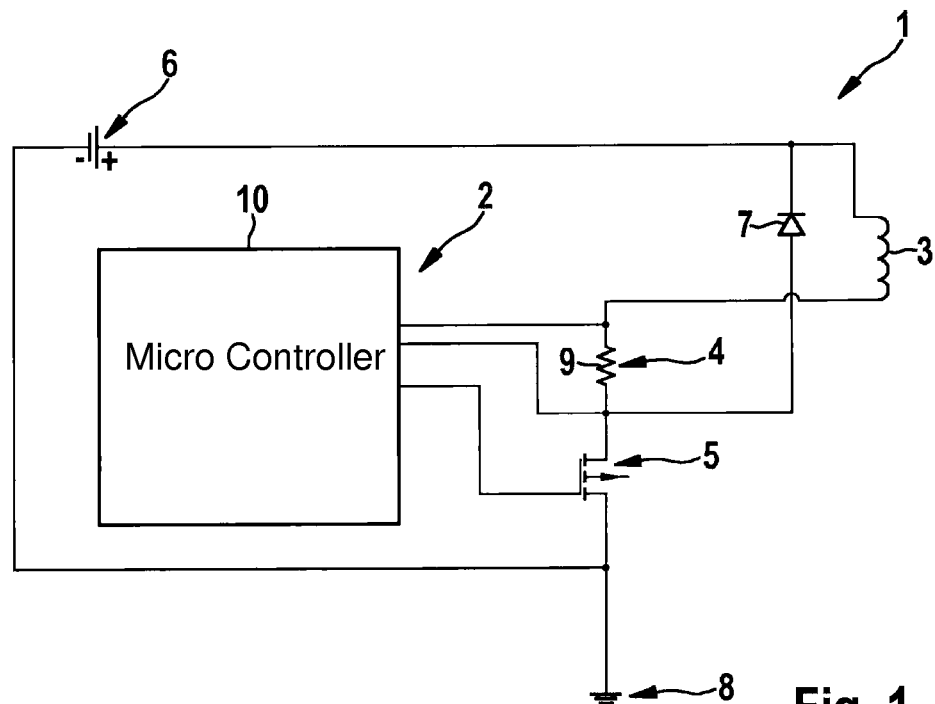
FIG. 1 shows a first specific embodiment of a circuit configuration.

FIG. 1 shows a circuit configuration 1, which includes a control unit 2, an inductive consumer 3, a current measuring unit 4 and a switching device 5. A power supply 6 is also provided. Connected jointly to the power supply are consumer 3, current measuring unit 4 and switching device 5, these being connected in series to one another. A free-wheeling element 7 in the form of a free-wheeling diode is connected at least in parallel to consumer 3, preferably, however, also in parallel to current measuring unit 4. The cathode of free-wheeling element 7 is connected to a positive pole of power supply 6, whereas the anode of the free-wheeling element is connected either between consumer 3 and current measuring unit 4 or (as depicted here), between current measuring unit 4 and switching device 5. Consumer 3 is present, for example, as a solenoid valve or as a coil of the solenoid valve.

The side of switching device 5 facing away from consumer 3 is connected to a ground 8. This is optional, however. Both current measuring unit 4, which includes a shunt-resistor 9, for example, and switching device 5, which is formed by a power electronic switch, for example, are connected to control unit 2. Control unit 2, which in this case is a microcontroller 10, ascertains the actual current intensity of the electric current flowing through consumer 3 with the aid of current measuring unit 4 and shunt resistor 9. In addition, control unit 2 activates switching device 5 during a pulse width modulation period in such a way that the current intensity or the actual current intensity is controlled.

Instead of the low-side configuration depicted herein, switching device 5 may, of course, also be situated in a high-side configuration, i.e., on the side of consumer 3 facing the positive pole of power supply 6.

Figure 2:
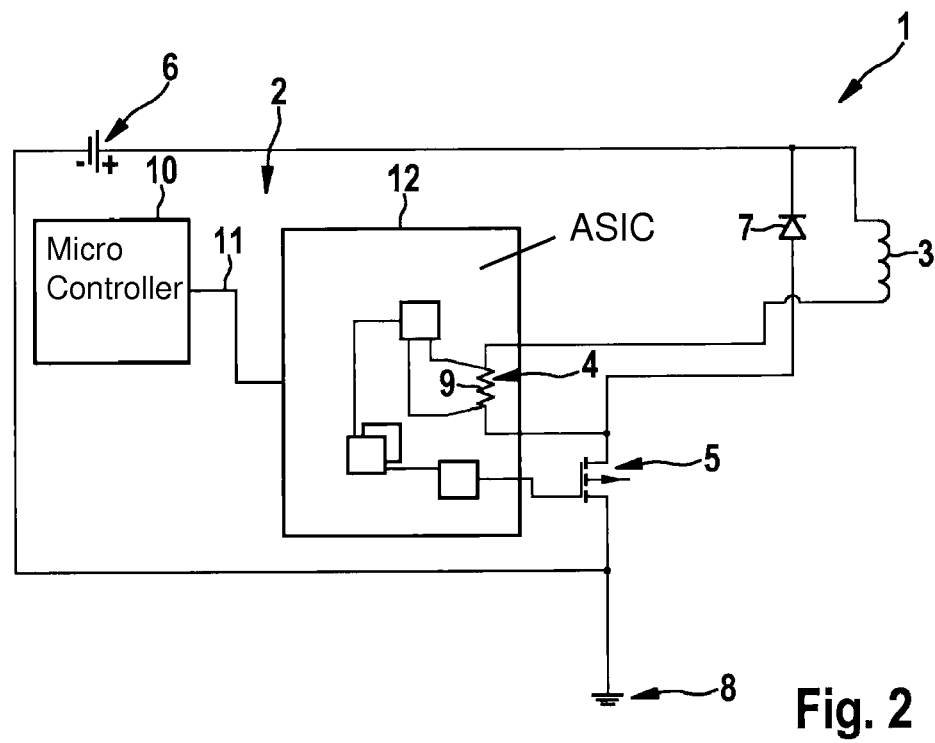
FIG. 2 shows a second specific embodiment of the circuit configuration.

FIG. 2 shows another specific embodiment of circuit configuration 1. This differs from the specific embodiment described with reference to FIG. 1 in that microcontroller 10 is now only connected via a bus 11 to an application-specific, integrated circuit (ASIC: application-specific integrated circuit). This circuit 12 integrates current measuring unit 4 and means for activating switching device 5. It is, of course, additionally possible to integrate switching device 5 into circuit 12, for example. At the same time, circuit 12 may be designed to control the current intensity for multiple consumers 3, i.e., in this regard, to include multiple channels. Circuit 12 may also be used for diagnostic purposes. Finally, it is also possible to integrate microcontroller 10 into circuit 12.

Figure 3:
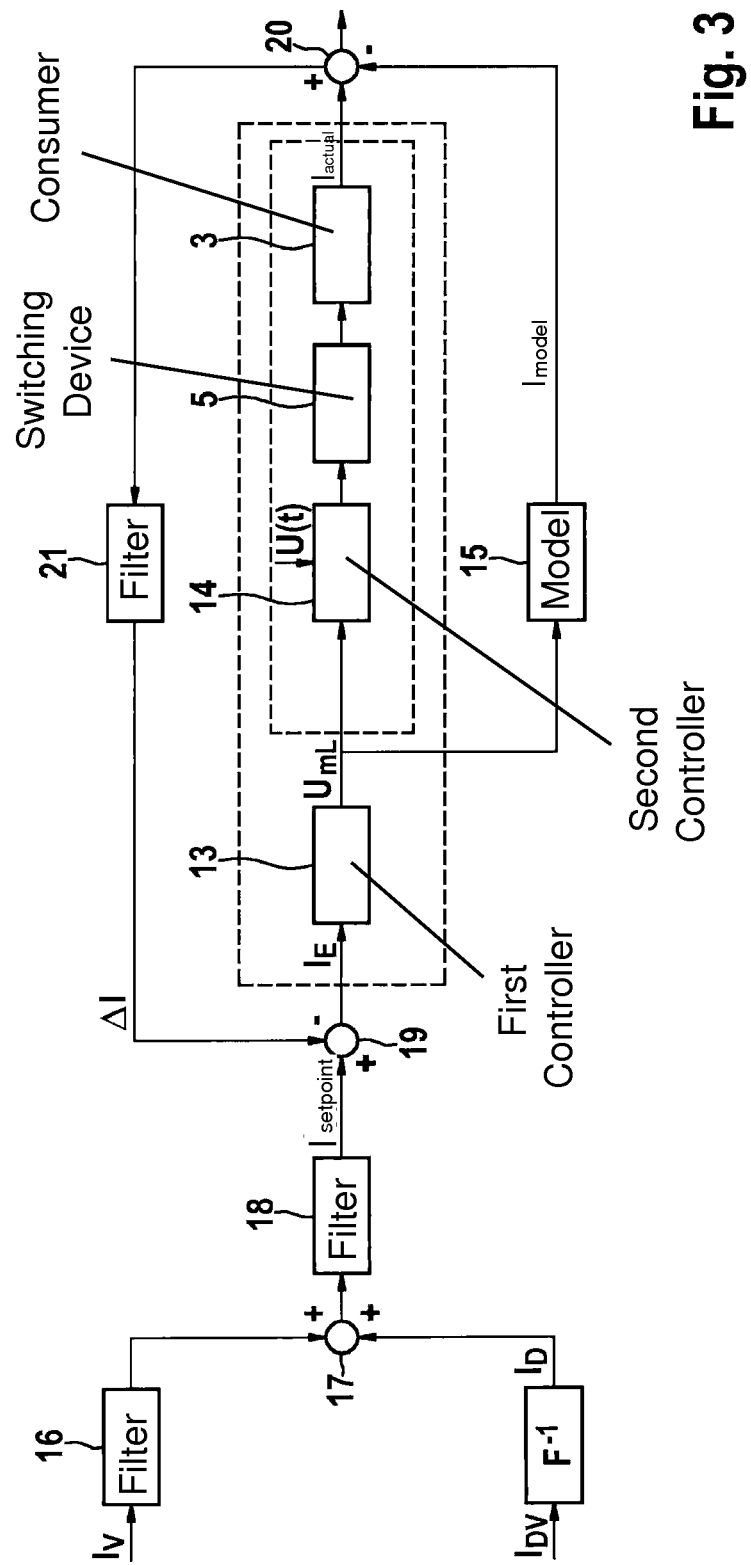
FIG. 3 shows a schematic representation of the method in a first embodiment implemented with the aid of the circuit configuration.

FIG. 3 shows a schematic representation of a method for controlling the current intensity of the electric current flowing through consumer 3, which is implemented, for example, with the aid of aforementioned circuit configuration 1 or control unit 2. In particular, consumer 3, switching device 5, a first controller 13, a second controller 14 and a model 15 are depicted. A target current intensity $I_V$ and a superposition target current intensity $I_{DV}$ are used as input variables. Target current intensity $I_V$ is conducted past a filter 16 and subsequently provided at a connection point 17. Superposition target current intensity $I_{DV}$ is converted into a superposition current intensity $I_D$ with the aid of an inverted transfer function of a control loop made up of first controller 13 and consumer 3. This is also provided at connection point 17. There it is added to target current intensity $I_V$, resulting in a setpoint current intensity $I_{setpoint}$, which is subsequently passed over a filter 18, for example.

Setpoint current intensity $I_{setpoint}$ is fed to a connection point 19, in which a difference variable $\Delta I$ is subtracted from it. The result of this subtraction is an input current intensity $I_E$, which is fed to first controller 13 as an (in particular, the only) input variable. This first controller 13 is preferably designed as an IMC controller and determines a mean load voltage $U_{mL}$ from input current intensity $I_E$. This load voltage is provided as an input variable to both controller 14 and to model 15, in each case as an input variable. In addition, an instantaneous supply voltage $U(t)$ of power supply 6 is fed to controller 14. Controller 14 determines a pulse duty factor from the variables fed to it, and activates switching device 5 accordingly, so that consumer 3 is either supplied with current of power supply 6 or the power supply is interrupted.

The actual current intensity $I_{actual}$ determined with the aid of current measuring unit 4 and shunt resistor 9 is fed to a connection point 20. At the same time, model 15, which is adapted to consumer 3 or consumers 3 and switching device 5, calculates a model current intensity $I_{model}$. This is also fed to connection point 20, where it is subtracted from actual current intensity $I_{actual}$. The result of this subtraction represents difference variable $\Delta I$, which is optionally passed over a filter 21, for example, an I-element. By restoring difference variable $\Delta I$, the control loop is closed. Accordingly, disturbances, which occur in the controlled system made up of consumer 3 and switching device 5, may be corrected by first controller 13.

Figure 4:
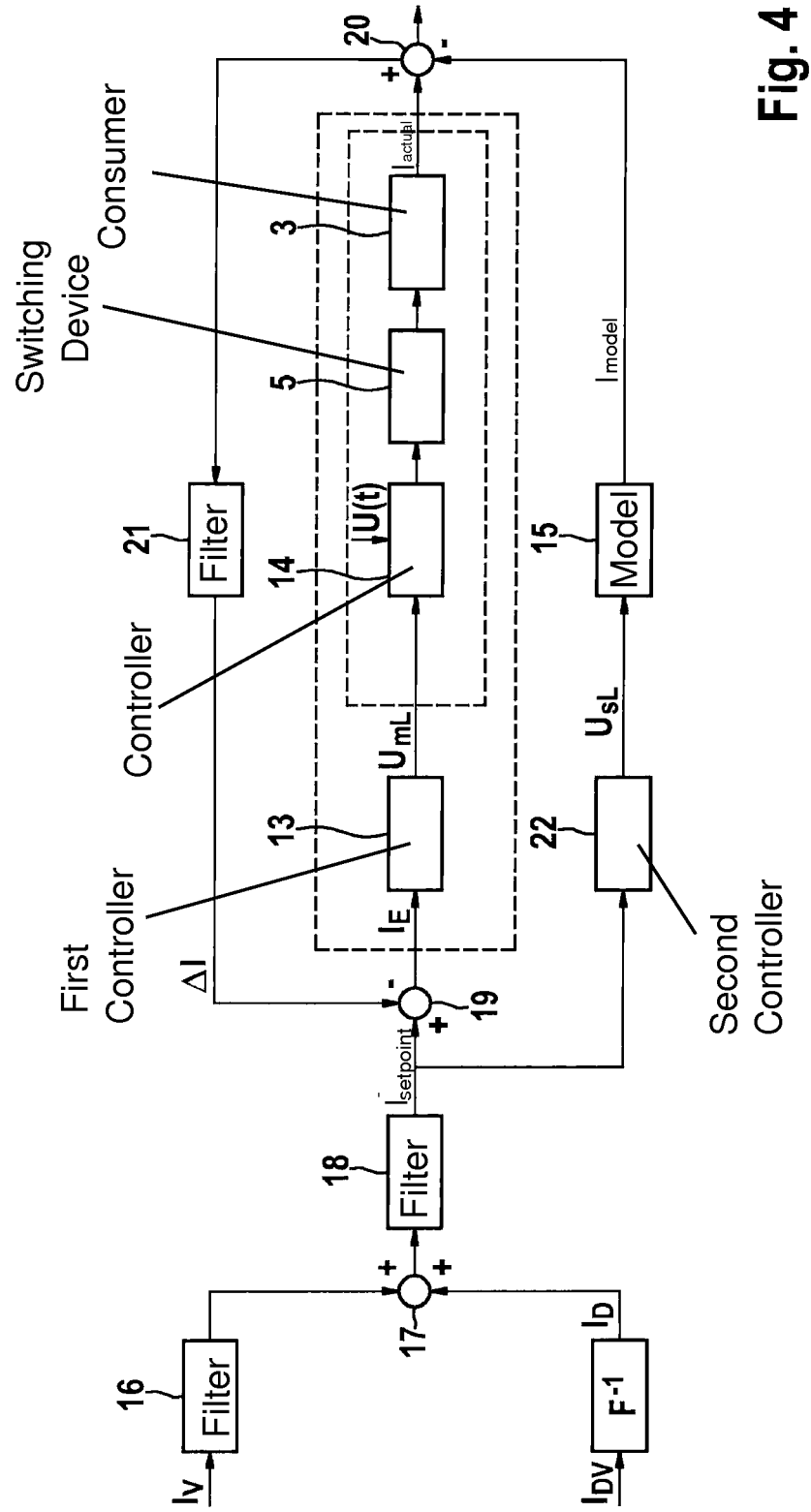
FIG. 4 shows a schematic representation of the method in a second embodiment.

FIG. 4 shows a schematic view of another embodiment of the method known from FIG. 3. This embodiment differs in that the mean load voltage $U_{mL}$ determined with the aid of first controller 13 is not fed to model 15. Instead, a second controller 22 is provided, to which setpoint current intensity $I_{setpoint}$ is fed as a (preferably the only) input variable. From this setpoint current intensity $I_{setpoint}$, second controller 22 determines a setpoint load voltage $U_{sL}$ which, instead of mean load voltage $U_{mL}$, is fed to model 15. In this way, it is possible, for example, to correct the mean value error described above. It is expressly noted that filters 16, 18, and 21 in both embodiments of the method are optional, i.e., may not be provided.

Figure 5:
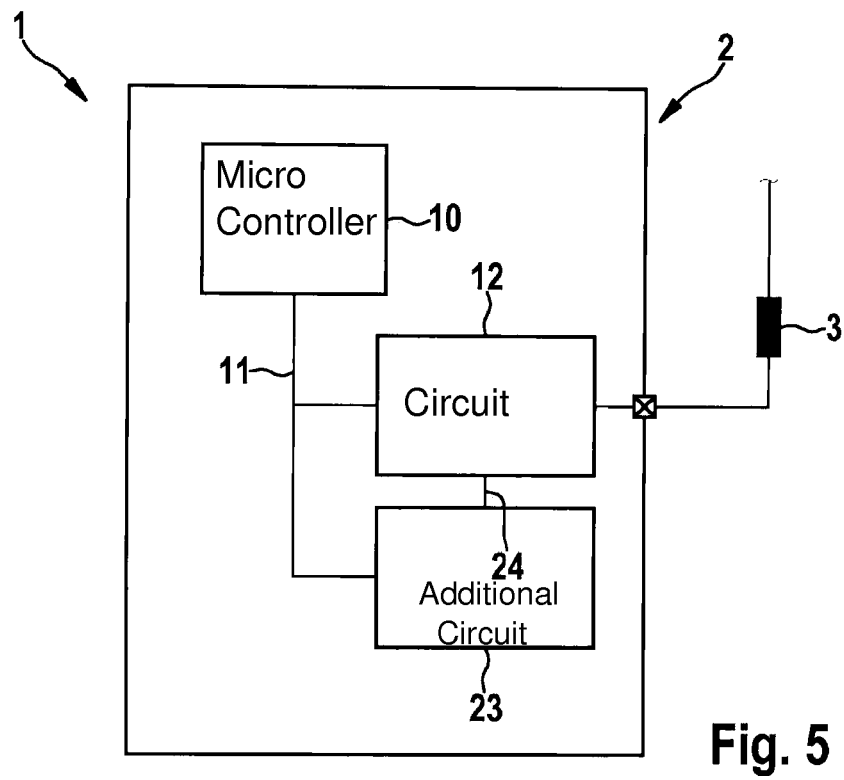
FIG. 5 shows a detailed view of an area of the circuit configuration in a first variant.

FIG. 5 shows a detailed view of a first variant of circuit configuration 1, which may be applied, in particular, to the specific embodiment depicted in FIG. 2. Depicted in schematic form is consumer 3 and its electrical connection to circuit 12. The circuit, in turn, is connected to microcontroller 10 via bus 11 in the manner described above. Now, however, an additional circuit 23 is provided, which is also connected to microcontroller 10 via bus 11. In addition, another connection 24 may be present directly between circuits 12 and 23. In this way, it is possible to use circuit 23 for monitoring circuit 12, for example, by having circuit 23 as well as circuit 12 determine an activation signal or a pulse duty factor for switching device 5. The two activation signals or pulse duty factors ascertained in this way are subsequently compared with one another and, only if they coincide, are used to activate switching device 5 and, therefore, to supply consumer 3 with current from power supply 6. Circuits 12 and 23 are each designed, in particular, as ASICs.

Figure 6:
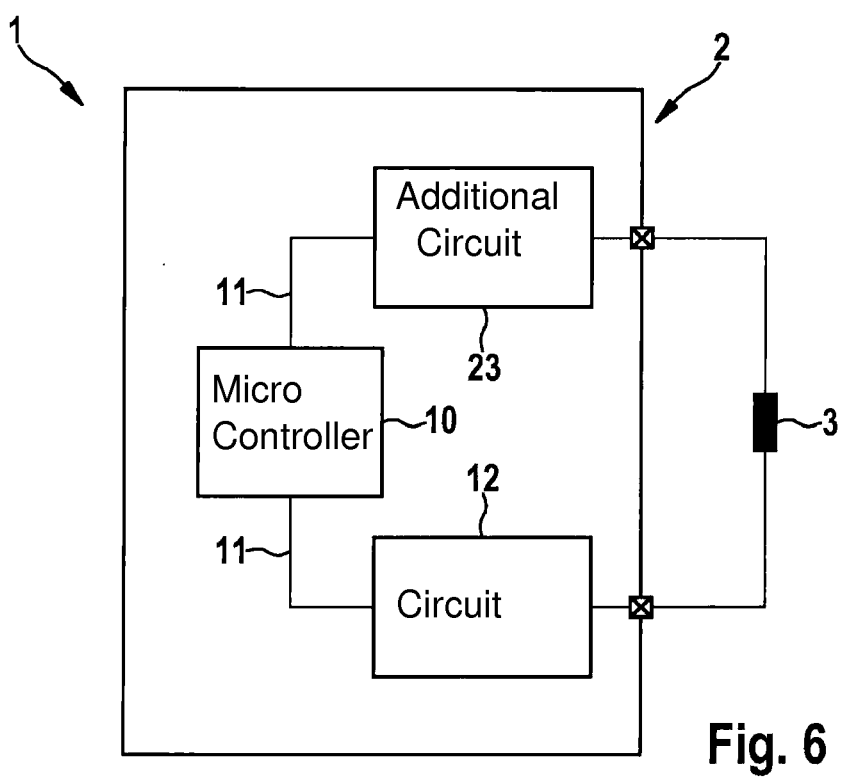
FIG. 6 shows a detailed view of the circuit configuration in a second variant.

FIG. 6 shows a detailed view of another variant of circuit configuration 1, which may be employed in safety-critical areas. Similar to the variant depicted in FIG. 5, to which express reference is made, two circuits 12 and 23 are provided. Circuit 23, however, is not used solely for monitoring, but is also electrically connected to consumer 3. Circuit 12 in this case activates switching device 5, for example, whereas circuit 23 activates another switching device not depicted here. The first of the two operates, therefore, as a low-side switch for consumer 3, whereas the second of the two is used as a high-side switch. However, a reversed order is, of course, also implementable. Circuit 23 is also used to monitor circuit 12 and is permanently conductive during a normal operation. If, however, an error of circuit 12 is detected, then it is possible with the aid of circuit 23 to interrupt the supply of electric current to consumer 3.

Thus, even if circuit 12 remains in a state in which consumer 3 is permanently connected to ground 8, circuit 23 is able to interrupt the power supply of consumer 3. In this way, a monitoring of actual current intensity $I_{actual}$ or setpoint current intensity $I_{setpoint}$ according to ASIL D is implemented. Such an ASIL D system may also be implemented with merely one circuit 12, in particular, if a detection of the switching signal used to activate switching device 5, i.e., the PWM signal, is integrated into circuit 12. In this case, a redundant monitoring path may be implemented with a diagnosis based on the detected switching signal. At this juncture, state variables of a device including circuit configuration 1, for example, of a transmission, are evaluated. Such variables are, for example, the transmission oil temperature or the expected ohmic resistance of consumer 3. A current intensity of the current flowing consumer 3 to be expected may be calculated from the supply voltage, the detected switching signal and the calculated resistance. This expected current intensity is compared with setpoint current intensity $I_{setpoint}$. If a difference occurs, in particular, a difference which exceeds a particular limiting value, control unit 2 or circuit 12 may activate switching device 5 in order to interrupt the power supply of consumer 3.

It is possible, within the scope of all specific embodiments described above, to carry out a diagnosis in a simple manner. This is implemented, for example, with the aid of at least one counter. If the error exceeds, per time unit, for example, a particular maximum error number, an error signal may then be output. Appropriate counter measures may be initiated based on this error signal. The counter is incremented, for example, if during a pulse width modulation period a deviation of actual current intensity $I_{actual}$ from setpoint current intensity $I_{setpoint}$ exceeds a certain maximum deviation. In particular, a comparison provided in this case between actual current intensity $I_{actual}$ and setpoint current intensity $I_{setpoint}$ is carried out exactly once per pulse width modulation period.

What is claimed is:

1. A method for controlling a current intensity of an electric current flowing through an inductive consumer, the consumer being connected in series to a switching device and a current measuring unit, and in parallel to a freewheeling element, the method comprising:
   activating the switching device for adjusting the current intensity during a pulse width modulation period;
   determining a mean load voltage to be set during the pulse width modulation period from an input current intensity with the aid of a first controller;
   setting the mean load voltage during the pulse width modulation period with the aid of the switching device at the consumer;
   supplying, to a model adapted to the consumer, one of the mean load voltage and a setpoint load voltage determined with the aid of a second controller from a predefined setpoint current intensity;
   ascertaining the input current intensity from a difference between the predefined setpoint current intensity and a difference variable between an actual current intensity through the consumer and a model current intensity determined with the aid of the model;
   determining the setpoint current intensity from a target current intensity and a superposition current intensity; and
   determining the superposition current intensity from a superposition target current intensity with the aid of an inverted transfer function of a control loop made up of the first controller and the consumer.

2. The method as recited in claim 1, wherein the mean load voltage is at least one of limited downward to a minimum value and limited upward to a maximum value.

3. The method as recited in claim 2, wherein a mean supply voltage of a power supply for the consumer is used as the maximum value.

4. The method as recited in claim 2, wherein one of a free-wheeling voltage and an absolute value of a free-wheeling voltage of the free-wheeling element is used as the minimum value.

5. The method as recited in claim 1, further comprising:
   determining, at least once during the pulse width modulation period, a pulse duty factor for the pulse width modulation period to be set with the aid of the switching device from the mean load voltage and an instantaneous supply voltage of a power supply.

6. The method as recited in claim 5, further comprising:
   determining the mean load voltage from the input current intensity with the aid of the first controller with a pulse width modulation frequency; and
   determining the pulse duty factor with a sampling frequency selected to be greater than the pulse width modulation frequency.

7. The method as recited in claim 1, wherein the difference variable corresponds to a difference between the actual current intensity through the consumer and the model current intensity determined with the aid of the model.

8. The method as recited in claim 7, wherein the difference between the actual current intensity through the consumer and the model current intensity determined with the aid of the model is guided by a transfer element.

9. The method as recited in claim 1, further comprising:
   filtering at least one of the target current intensity, the setpoint current intensity, and the input current intensity.

10. A circuit configuration, comprising:
    a control unit for controlling a current intensity of an electric current flowing through an inductive consumer;
    a switching device;
    a current measuring unit;
    a first controller;
    a second controller; and
    a freewheeling element, wherein:

the consumer is connected in series to the switching device and the current measuring unit, and in parallel to the freewheeling element, the control unit activates the switching device for adjusting the current intensity during a pulse width modulation period, the control unit determines a mean load voltage to be set during the pulse width modulation period from an input current intensity with the aid of the first controller, the mean load voltage is set during the pulse width modulation period with the aid of the switching device at the consumer, one of the mean load voltage and a setpoint load voltage is determined with the aid of the second controller from a predefined setpoint current intensity being fed to a model adapted to the consumer, the input current intensity is ascertained from a difference between the predefined setpoint current intensity and a difference variable between an actual current intensity through the consumer and a model current intensity determined with the aid of the model, the setpoint current intensity is determined from a target current intensity and a superposition current intensity; and the superposition current intensity is determined from a superposition target current intensity with the aid of an inverted transfer function of a control loop made up of the first controller and the consumer.

* * * * *